(12) United States Patent
Heckmeier et al.

(10) Patent No.: US 8,586,684 B2
(45) Date of Patent: Nov. 19, 2013

(54) CONJUGATED COPOLYMER

(75) Inventors: Michael Heckmeier, Hemsbach (DE); William Mitchell, Chandler's Ford (GB); Weimin Zhang, Southampton (GB); David Sparrowe, Southampton (GB); Giles Lloyd, Hedge End (GB); Steven Tierney, Carlisle Road (GB); Stephan Derow, Griesheim (DE)

(73) Assignee: MERCK PATENT GmbH, Darmstadt (DE)

( * ) Notice: Subject to any disclaimer, the term of this patent is extended or adjusted under 35 U.S.C. 154(b) by 283 days.

(21) Appl. No.: 12/743,673

(22) PCT Filed: Oct. 23, 2008

(86) PCT No.: PCT/EP2008/008972
§ 371 (c)(1),
(2), (4) Date: May 19, 2010

(87) PCT Pub. No.: WO2009/065479
PCT Pub. Date: May 28, 2009

(65) Prior Publication Data
US 2010/0256328 A1    Oct. 7, 2010

(30) Foreign Application Priority Data

Nov. 21, 2007   (EP) .................................. 07022611

(51) Int. Cl.
*C08F 283/00* (2006.01)
*C08G 73/06* (2006.01)
*C08G 73/00* (2006.01)

(52) U.S. Cl.
USPC ............ 525/540; 528/373; 528/396; 528/422

(58) Field of Classification Search
USPC .......................... 528/396, 422, 373; 525/540
See application file for complete search history.

(56) References Cited

FOREIGN PATENT DOCUMENTS

| WO | 2004106409 A1 | 12/2004 |
| WO | 2005024971 A1 | 3/2005 |
| WO | 2006015862 A1 | 2/2006 |
| WO | 2007131582 A1 | 11/2007 |
| WO | 2008011953 A1 | 1/2008 |
| WO | PCTEP0808972 R | 2/2009 |

*Primary Examiner* — Duc Truong
(74) *Attorney, Agent, or Firm* — Millen, White, Zelano & Branigan, P.C.

(57) ABSTRACT

The invention relates to a conjugated copolymer comprising indenofluorene and triarylamine units and to its use in organic electronic devices.

33 Claims, 1 Drawing Sheet

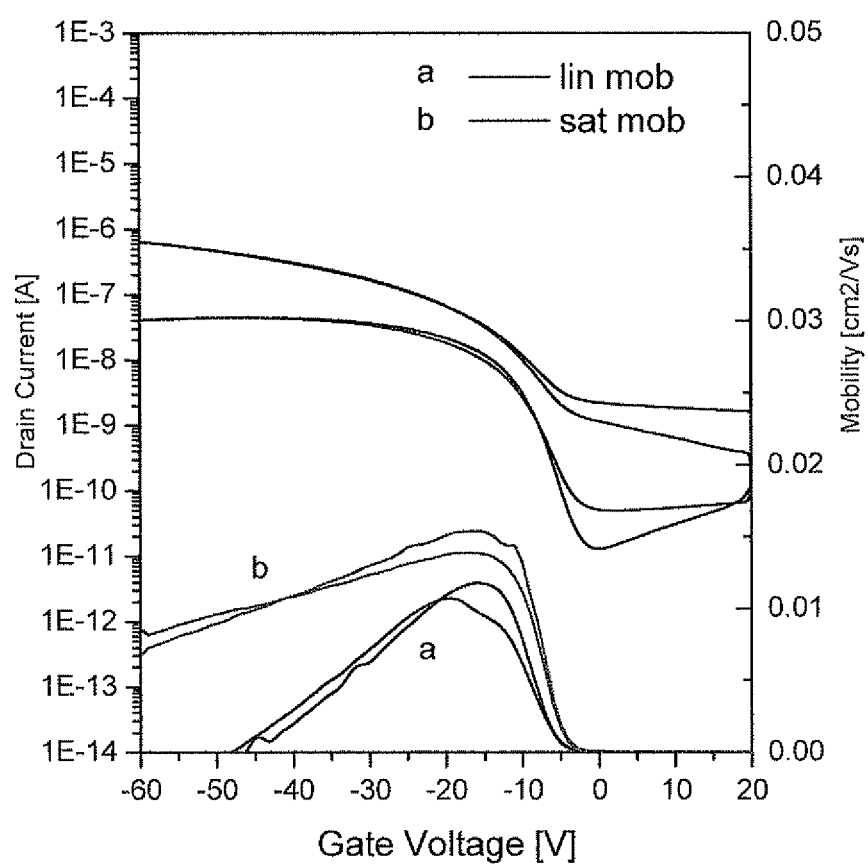

CONJUGATED COPOLYMER

FIELD OF THE INVENTION

The invention relates to a conjugated copolymer comprising indenofluorene and triarylamine units and to its use in organic electronic devices.

BACKGROUND AND PRIOR ART

In recent years, there has been development of organic semiconducting (OSC) materials in order to produce more versatile, lower cost electronic devices. Such materials find application in a wide range of devices or apparatus, including organic field effect transistors (OFETs), organic light emitting diodes (OLEDs), photodetectors, photovoltaic (PV) cells, sensors, memory elements and logic circuits to name just a few. The organic semiconducting materials are typically present in the electronic device in the form of a thin layer, for example less than 1 micron thick.

The performance of OFET devices is principally based upon the charge carrier mobility of the semiconducting material and the current on/off ratio, so the ideal semiconductor should have a low conductivity in the off state, combined with a high charge carrier mobility ($>1\times10^{-3}$ $cm^2V^{-1}s^{-1}$). In addition, it is important that the semiconducting material is relatively stable to oxidation i.e. it has a high ionisation potential, as oxidation leads to reduced device performance. Further requirements for the semiconducting material are a good processability, especially for large-scale production of thin layers and desired patterns, and high stability, film uniformity and integrity of the organic semiconductor layer.

In prior art various materials have been proposed for use as organic semiconductors in OFETs, including small molecules like for example pentacene, and polymers like for example polyhexylthiophene. However, the materials and devices investigated so far do still have several drawbacks, and their properties, especially the processability, charge-carrier mobility, on/off ratio and stability do still leave room for further improvement.

One aim of the present invention is to provide new organic semiconducting materials for use in electronic devices, which have advantageous properties, in particular good processability, high charge-carrier mobility, high on/off ratio, high oxidative stability and long lifetime in electronic devices. Another aim is to extend the pool of semiconducting materials available to the expert. Other aims of the present invention are immediately evident to the expert from the following detailed description.

It has been found that these aims can be achieved by providing semiconducting materials as claimed in the present invention. These materials are based on polymers comprising one or more cis- or trans-indenofluorene units of the following formulae, or derivatives thereof

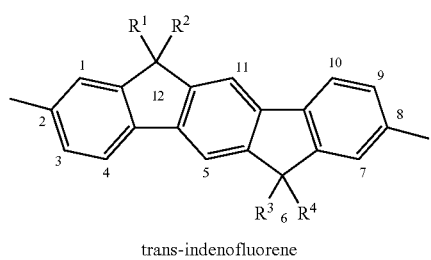

trans-indenofluorene

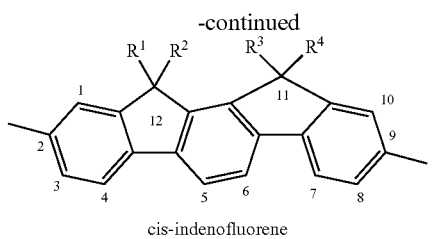

cis-indenofluorene (wherein $R^{1-4}$ denote aromatic or aliphatic hydrocarbyl groups, and two adjacent groups $R^{1,2}$ or $R^{3,4}$ may also form a spiro group),
and further comprising one or more triarylamine moieties. In particular, it has been found that such polymers are suitable for use as semiconducting materials in electronic devices like transistors, and as charge transport layer or interlayer in polymer light emitting diodes (PLEDs), as they have good processibility and at the same time show a high charge carrier mobility and high oxidative stability.

WO 2004/041901 describes polymers comprising aryl-substituted indenofluorenes and further units like triarylamine or heteroaryl moieties, and their use in OLED or OFET devices, but does not disclose a device as claimed in the present invention. WO 2005/024971 discloses an OLED device comprising a crosslinked buffer layer as electron blocking layer, and further discloses a polymer comprising 50% indenofluorene and 50% triarylamine units, but does not disclose a polymer as claimed in the present invention.

Triarylamines have good hole transport ability. However, they have only moderate solubility in many organic solvents, which does negatively affect their processability in a film-forming process and leads to films with moderate uniformity. Indenofluorenes, on the other hand, are soluble in conventional organic solvents and thus show good processability, enabling the formation of films with high uniformity. However, they have been reported mainly to be efficient electron transporting and light-emitting moieties. It was therefore surprising that a polymer according to the present invention, wherein indenofluorene units are combined with hole transporting moieties like triarylamines, shows high charge carrier mobility and enables the preparation of electronic devices like transistors with high on/off ratios.

SUMMARY OF THE INVENTION

The invention relates to a conjugated copolymer comprising >50 mol % of one or more identical or different units of formula I

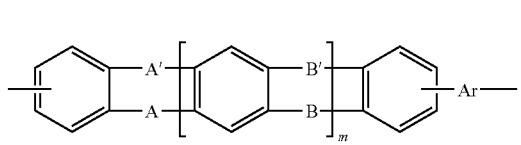

and >0 mol % and <50 mol % of one or more identical or different units of formula II

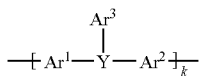

II wherein
one of A and A' is a single bond and the other is $CR^1R^2$,
one of B and B' is a single bond and the other is $CR^3R^4$,
$R^{1-4}$ are independently of each other identical or different groups selected from H, halogen, —CN, —NC, —NCO, —NCS, —OCN, —SCN, —C(=O)$NR^0R^{00}$, —C(=O)X, —C(=O)$R^0$, —$NH_2$, —$NR^0R^{00}$, —SH, —$SR^0$, —$SO_3H$, —$SO_2R^0$, —OH, —$NO_2$, —$CF_3$, —$SF_5$, optionally substituted silyl, or carbyl or hydrocarbyl with 1 to 40 C atoms that is optionally substituted and optionally comprises one or more hetero atoms,
X is halogen,
$R^0$ and $R^{00}$ are independently of each other H or an optionally substituted carbyl or hydrocarbyl group optionally comprising one or more hetero atoms,
Ar is a single bond or denotes mononuclear or polynuclear aryl or heterorayl,
m is an integer ≥1,
Y is N, P, P=O, $PF_2$, P=S, As, As=O, As=S, Sb, Sb=O or Sb=S,
$Ar^1$ which may be the same or different, denote, independently if in different repeat units, a single bond or an optionally substituted mononuclear or polynuclear aryl group,
$Ar^2$ which may be the same or different, denote, independently if in different repeat units, an optionally substituted mononuclear or polynuclear aryl group,
$Ar^3$ which may be the same or different, denote, independently if in different repeat units, an optionally substituted mononuclear or polynuclear aryl group, which may be optionally substituted by a bridging group linking different chain residues of formula III, and
k is 1, 2 or 3.
and
wherein optionally the groups $R^1$ and $R^2$ and/or the groups $R^3$ and $R^4$ together with the adjacent fluorene moiety form a spiro group.

The invention further relates to the use of the copolymers as described above and below in an organic electronic device as described above and below.

The invention relates to an organic electronic device comprising a semiconducting layer comprising a conjugated copolymer as described above and below.

The organic electronic device includes, without limitation, organic field effect transistors (OFET), thin film transistors (TFT), integrated circuits (IC), radio frequency identification (RFID) tags, photodetectors, sensors, logic circuits, memory elements, capacitors, organic photovoltaic (OPV) cells, charge injection layers, charge transport layers or interlayers in polymer light emitting diodes (PLEDs), Schottky diodes, planarising layers, antistatic films, polymer electrolyte membranes (PEM), conducting substrates or patterns, photoconductors, electrophotographic elements and organic light emitting diodes (OLED).

BRIEF DESCRIPTION OF THE DRAWINGS

FIG. 1 shows the source-drain current vs. gate voltage characteristic of an OFET prepared according to example 2.

DETAILED DESCRIPTION OF THE INVENTION

The term "polymer" generally means a molecule of high relative molecular mass, the structure of which essentially comprises the multiple repetition of units derived, actually or conceptually, from molecules of low relative molecular mass (PAC, 1996, 68, 2291). The term "oligomer" generally means a molecule of intermediate relative molecular mass, the structure of which essentially comprises a small plurality of units derived, actually or conceptually, from molecules of lower relative molecular mass (PAC, 1996, 68, 2291). In a preferred sense according to the present invention a polymer means a compound having >1, preferably >10 repeating units, and an oligomer means a compound with >1 and <20, preferably ≤10, repeating units.

The term "repeating unit" means the constitutional repeating unit (CRU), which is the smallest constitutional unit the repetition of which constitutes a regular macromolecule, a regular oligomer molecule, a regular block or a regular chain (PAC, 1996, 68, 2291).

The term "leaving group" means an atom or group (charged or uncharged) that becomes detached from an atom in what is considered to be the residual or main part of the molecule taking part in a specified reaction (see also PAC, 1994, 66, 1134).

The term "conjugated" means a compound containing mainly C atoms with $sp^2$-hybridisation (or optionally also sp-hybridisation), which may also be replaced by hetero atoms. In the simplest case this is for example a compound with alternating C—C single and double (or triple) bonds, but does also include compounds with units like 1,3-phenylene. "Mainly" means in this connection that a compound with naturally (spontaneously) occurring defects, which may lead to interruption of the conjugation, is still regarded as a conjugated compound.

Unless stated otherwise, the molecular weight is given as the number average molecular weight $M_n$ determined by gel permeation chromatography (GPC) against polystyrene standards. The degree of polymerization (n) means the number average degree of polymerization, given as $n=M_n/M_U$, wherein $M_U$ is the molecular weight of the single repeating unit.

The term "carbyl group" as used above and below denotes any monovalent or multivalent organic radical moiety which comprises at least one carbon atom either without any non-carbon atoms (like for example —C≡C—), or optionally combined with at least one non-carbon atom such as N, O, S, P, Si, Se, As, Te or Ge (for example carbonyl etc.). The term "hydrocarbyl group" denotes a carbyl group that does additionally contain one or more H atoms and optionally contains one or more hetero atoms like for example N, O, S, P, Si, Se, As, Te or Ge.

A carbyl or hydrocarbyl group comprising a chain of 3 or more C atoms may also be linear, branched and/or cyclic, including Spiro and/or fused rings.

Preferred carbyl and hydrocarbyl groups include alkyl, alkoxy, alkylcarbonyl, alkoxycarbonyl, alkylcarbonyloxy and alkoxycarbonyloxy, each of which is optionally substituted and has 1 to 40, preferably 1 to 25, very preferably 1 to 18 C atoms, furthermore optionally substituted aryl or aryloxy having 6 to 40, preferably 6 to 25 C atoms, furthermore alkylaryloxy, arylcarbonyl, aryloxycarbonyl, arylcarbonyloxy and aryloxycarbonyloxy, each of which is optionally substituted and has 6 to 40, preferably 7 to 40 C atoms.

The carbyl or hydrocarbyl group may be a saturated or unsaturated acyclic group, or a saturated or unsaturated cyclic group. Unsaturated acyclic or cyclic groups are preferred, especially aryl, alkenyl and alkynyl groups (especially ethynyl). Where the $C_1$-$C_{40}$ carbyl or hydrocarbyl group is acyclic, the group may be linear or branched. The $C_1$-$C_{40}$ carbyl or hydrocarbyl group includes for example: a $C_1$-$C_{40}$ alkyl group, a $C_2$-$C_{40}$ alkenyl group, a $C_2$-$C_{40}$ alkynyl group, a $C_3$-$C_{40}$ alkyl group, a $C_4$-$C_{40}$ alkyldienyl group, a $C_4$-$C_{40}$ polyenyl group, a $C_6$-$C_{18}$ aryl group, a $C_2$-$C_{18}$ heteroaryl group, a $C_6$-$C_{40}$ alkylaryl group, a $C_6$-$C_{40}$ arylalkyl group, a $C_4$-$C_{40}$ cycloalkyl group, a $C_4$-$C_{40}$ cycloalkenyl group, and the like. Preferred among the foregoing groups are a $C_1$-$C_{20}$ alkyl group, a $C_2$-$C_{20}$ alkenyl group, a $C_2$-$C_{20}$ alkynyl group, a $C_3$-$C_{20}$ alkyl group, a $C_4$-$C_{20}$ alkyldienyl group, a $C_6$-$C_{12}$ aryl group, a $C_2$-$C_{12}$ heteroaryl group and a $C_4$-$C_{20}$ polyenyl group, respectively. Also included are combinations of groups having carbon atoms and groups having hetero atoms, like e.g. an alkynyl group, preferably ethynyl, that is substituted with a silyl group, preferably a trialkylsilyl group.

Further preferred carbyl and hydrocarbyl groups include straight-chain, branched or cyclic alkyl with 1 to 40, preferably 1 to 25 C-atoms, which is unsubstituted, mono- or polysubstituted by F, Cl, Br, I or CN, and wherein one or more non-adjacent $CH_2$ groups are optionally replaced, in each case independently from one another, by —O—, —S—, —NH—, —NR$^o$—, —SiR$^o$R$^{oo}$—, —CO—, —COO—, —OCO—, —O—CO—O—, —S—CO—, —CO—S—, —SO$_2$—, —CO—NR$^o$—, —NR$^o$—CO—, —NR$^o$—CO—NR$^{oo}$—, —CY$^1$=CY$^2$— or —C≡C— in such a manner that O and/or S atoms are not linked directly to one another, wherein Y$^1$ and Y$^2$ are independently of each other H, F, Cl or CN, and R$^o$ and R$^{oo}$ are independently of each other H or an optionally substituted aliphatic or aromatic hydrocarbon with 1 to 20 C atoms.

R$^o$ and R$^{oo}$ are preferably selected from H, straight-chain or branched alkyl with 1 to 12 C atoms or aryl with 6 to 12 C atoms.

—CY$^1$=CY$^2$— is preferably —CH=CH—, —CF=CF— or —CH=C(CN)—.

Halogen is F, Cl, Br or I.

Preferred alkyl groups include, without limitation, methyl, ethyl, n-propyl, i-propyl, n-butyl, i-butyl, s-butyl, t-butyl, 2-methylbutyl, n-pentyl, s-pentyl, cyclopentyl, n-hexyl, cyclohexyl, 2-ethylhexyl, n-heptyl, cycloheptyl, n-octyl, cyclooctyl, dodecanyl, tetradecyl, hexadecyl, trifluoromethyl, perfluoro-n-butyl, 2,2,2-trifluoroethyl, perfluorooctyl, perfluorohexyl etc.

Preferred alkenyl groups include, without limitation, ethenyl, propenyl, butenyl, pentenyl, cyclopentenyl, hexenyl, cyclohexenyl, heptenyl, cycloheptenyl, octenyl, cyclooctenyl etc.

Preferred alkynyl groups include, without limitation, ethynyl, propynyl, butynyl, pentynyl, hexynyl, octynyl etc.

Preferred alkoxy groups include, without limitation, methoxy, ethoxy, 2-methoxyethoxy, n-propoxy, i-propoxy, n-butoxy, i-butoxy, s-butoxy, t-butoxy, 2-methylbutoxy, n-pentoxy, n-hexoxy, n-heptoxy, n-octoxy etc.

Preferred amino groups include, without limitation, dimethylamino, methylamino, methylphenylamino, phenylamino, etc.

Aryl groups may be mononuclear, i.e. having only one aromatic ring (like for example phenyl or phenylene), or polynuclear, i.e. having two or more aromatic rings which may be fused (like for example napthyl or naphthylene), individually covalently linked (like for example biphenyl), and/or a combination of both fused and individually linked aromatic rings. Preferably the aryl group is an aromatic group which is substantially conjugated over substantially the whole group.

Aryl and heteroaryl preferably denote a mono-, bi- or tricyclic aromatic or heteroaromatic group with up to 25 C atoms that may also comprise condensed rings and is optionally substituted.

Preferred aryl groups include, without limitation, benzene, biphenylene, triphenylene, [1,1:3',1"]terphenyl-2'-ylene, naphthalene, anthracene, binaphthylene, phenanthrene, pyrene, dihydropyrene, chrysene, perylene, tetracene, pentacene, benzpyrene, fluorene, indene, indenofluorene, spirobifluorene, etc.

Preferred heteroaryl groups include, without limitation, 5-membered rings like pyrrole, pyrazole, imidazole, 1,2,3-triazole, 1,2,4-triazole, tetrazole, furan, thiophene, selenophene, oxazole, isoxazole, 1,2-thiazole, 1,3-thiazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 6-membered rings like pyridine, pyridazine, pyrimidine, pyrazine, 1,3,5-triazine, 1,2,4-triazine, 1,2,3-triazine, 1,2,4,5-tetrazine, 1,2,3,4-tetrazine, 1,2,3,5-tetrazine, and fused systems like carbazole, indole, isoindole, indolizine, indazole, benzimidazole, benzotriazole, purine, naphthimidazole, phenanthrimidazole, pyridimidazole, pyrazin-imidazole, quinoxalinimidazole, benzoxazole, naphthoxazole, anthroxazole, phenanthroxazole, isoxazole, benzothiazole, benzofuran, isobenzofuran, dibenzofuran, quinoline, isoquinoline, pteridine, benzo-5,6-quinoline, benzo-6,7-quinoline, benzo-7,8-quinoline, benzoisoquinoline, acridine, phenothiazine, phenoxazine, benzopyridazine, benzopyrimidine, quinoxaline, phenazine, naphthyridine, azacarbazole, benzocarboline, phenanthridine, phenanthroline, thieno[2,3b]thiophene, thieno[3,2b]thiophene, dithienothiophene, dithienopyridine, isobenzothiophene, dibenzothiophene, benzothiadiazothiophene, or combinations thereof. The heteroaryl groups may be substituted with alkyl, alkoxy, thioalkyl, fluoro, fluoroalkyl or further aryl or heteroaryl substituents.

Preferred arylalkyl groups include, without limitation, 2-tolyl, 3-tolyl, 4-tolyl, 2,6-dimethylphenyl, 2,6-diethylphenyl, 2,6-di-1-propylphenyl, 2,6-di-t-butylphenyl, o-t-butylphenyl, m-t-butylphenyl, p-t-butylphenyl, 4-phenoxyphenyl, 4-fluorophenyl, 3-carbomethoxyphenyl, 4-carbomethoxyphenyl etc.

Preferred alkylaryl groups include, without limitation, benzyl, ethylphenyl, 2-phenoxyethyl, propylphenyl, diphenylmethyl, triphenylmethyl or naphthalinylmethyl.

Preferred aryloxy groups include, without limitation, phenoxy, naphthoxy, 4-phenylphenoxy, 4-methylphenoxy, biphenyloxy, anthracenyloxy, phenanthrenyloxy etc.

The aryl, heteroaryl, carbyl and hydrocarbyl groups optionally comprise one or more substituents, preferably selected from silyl, sulpho, sulphonyl, formyl, amino, imino, nitrilo, mercapto, cyano, nitro, halogen, $C_{1-12}$alkyl, $C_{6-12}$ aryl, $C_{1-12}$ alkoxy, hydroxy and/or combinations thereof. The optional substituents may comprise all chemically possible combinations in the same group and/or a plurality (preferably two) of the aforementioned groups (for example amino and sulphonyl if directly attached to each other represent a sulphamoyl radical).

Preferred substituents include, without limitation, F, Cl, Br, I, —CN, —NO$_2$, —NCO, —NCS, —OCN, —SCN, —C(=O)NR$^o$R$^{oo}$, —C(=O)X$^o$, —C(=O)R$^o$, —NR$^o$R$^{oo}$, optionally substituted silyl, aryl with 6 to 40, preferably 6 to 20 C atoms, heteroaryl with 2 to 40, preferably 2 to 20 C atoms, and straight chain or branched alkyl, alkoxy, alkylcarbonyl, alkoxy-carbonyl, alkylcarbonyloxy or alkoxycarbonyloxy with 1 to 20, preferably 1 to 12 C atoms, wherein one or more H atoms are optionally replaced by F or Cl, wherein R$^o$ and R$^{oo}$ are as defined above and X$^o$ is halogen.

Especially preferred substituents are selected from alkyl, alkoxy, alkenyl, oxaalkyl, thioalkyl, fluoroalkyl and fluoroalkoxy groups as defined for the preferred groups R$^{1,2}$ below.

If one of $R^{1-4}$ is an alkyl or alkoxy radical, i.e. where the terminal $CH_2$ group is replaced by —O—, this may be straight-chain or branched. It is preferably straight-chain, has 2 to 8 carbon atoms and accordingly is preferably ethyl, propyl, butyl, pentyl, hexyl, heptyl, octyl, ethoxy, propoxy, butoxy, pentoxy, hexyloxy, heptoxy, or octoxy, furthermore methyl, nonyl, decyl, undecyl, dodecyl, tridecyl, tetradecyl, pentadecyl, nonoxy, decoxy, undecoxy, dodecoxy, tridecoxy or tetradecoxy, for example. Especially preferred are n-hexyl and n-dodecyl.

If one of $R^{1-4}$ is an alkyl group wherein one or more $CH_2$ groups are replaced by —CH=CH—, this may be straight-chain or branched. It is preferably straight-chain, has 2 to 12 C-atoms and accordingly is preferably vinyl, prop-1-, or prop-2-enyl, but-1-, 2- or but-3-enyl, pent-1-, 2-, 3- or pent-4-enyl, hex-1-, 2-, 3-, 4- or hex-5-enyl, hept-1-, 2-, 3-, 4-, 5- or hept-6-enyl, oct-1-, 2-, 3-, 4-, 5-, 6- or oct-7-enyl, non-1-, 2-, 3-, 4-, 5-, 6-, 7- or non-8-enyl, dec-1-, 2-, 3-, 4-, 5-, 6-, 7-, 8- or dec-9-enyl, undec-1-, 2-, 3-, 4-, 5-, 6-, 7-, 8-, 9- or undec-10-enyl, dodec-1-, 2-, 3-, 4-, 5-, 6-, 7-, 8-, -9, -10 or undec-11-enyl. The alkenyl group may comprise C=C-bonds with E- or Z-configuration or a mixture thereof.

If one of $R^{1-4}$ is oxaalkyl, i.e. where one $CH_2$ group is replaced by —O—, is preferably straight-chain 2-oxapropyl (=methoxymethyl), 2-(=ethoxymethyl) or 3-oxabutyl (=2-methoxyethyl), 2-, 3-, or 4-oxapentyl, 2-, 3-, 4-, or 5-oxahexyl, 2-, 3-, 4-, 5-, or 6-oxaheptyl, 2-, 3-, 4-, 5-, 6- or 7-oxaoctyl, 2-, 3-, 4-, 5-, 6-, 7- or 8-oxanonyl or 2-, 3-, 4-, 5-, 6-, 7-, 8- or 9-oxadecyl, for example.

If one of $R^{1-4}$ is thioalkyl, i.e where one $CH_2$ group is replaced by —S—, is preferably straight-chain thiomethyl (—$SCH_3$), 1-thioethyl (—$SCH_2CH_3$), 1-thiopropyl (=—$SCH_2CH_2CH_3$), 1-(thiobutyl), 1-(thiopentyl), 1-(thiohexyl), 1-(thioheptyl), 1-(thiooctyl), 1-(thiononyl), 1-(thiodecyl), 1-(thioundecyl) or 1-(thiododecyl), wherein preferably the $CH_2$ group adjacent to the $sp^2$ hybridised vinyl carbon atom is replaced.

If one of $R^{1-4}$ is fluoroalkyl or fluoroalkoxy, it is preferably a straight-chain group $(O)C_iF_{2i+1}$, wherein i is an integer from 1 to 15, in particular $CF_3$, $C_2F_5$, $C_3F_7$, $C_4F_9$, $C_5F_{11}$, $C_6F_{13}$, $C_7F_{15}$ or $C_8F_{17}$, very preferably $C_6F_{13}$, or the corresponding fluoroalkoxy group.

If the groups $R^1$ and $R^2$ and/or the groups $R^3$ and $R^4$ form a spiro group together with the fluorene group, it is preferably spirobifluorene.

Preferred units of formula I are those wherein

Ar is either a single bond or an optionally substituted mononuclear or polynuclear aryl group, very preferably a single bond, Ar is selected from optionally substituted indenofluorene, optionally substituted spirobifluorene, optionally substituted 9,10-dihydrophenanthrene or optionally substituted phenanthrene, m is <10, very preferably 1, 2, 3, 4 or 5, most preferably 1, A' is $CR^1R^2$, B is $CR^3R^4$, Ar is a single bond, and m is preferably 1, A' is $CR^1R^2$, B' is $CR^3R^4$, Ar is a single bond, and m is preferably 1, $R^{1-4}$ denote optionally substituted carbyl or hydrocarbyl, very preferably optionally substituted alkyl, aryl or heteroaryl.

In units of formula I wherein m>1, the meanings of B and B' in each indenofluorene group are selected independently of the other indenofluorene groups. Thus, the units of formula I may consist exclusively of fused cis-indenfluorene moieties, or may consist exclusively of fused trans-indenofluorene moieties, or may comprise alternating or random sequences of fused cis- and trans-indenofluorene moieties.

The units of formula I are preferably selected from the following subformulae:

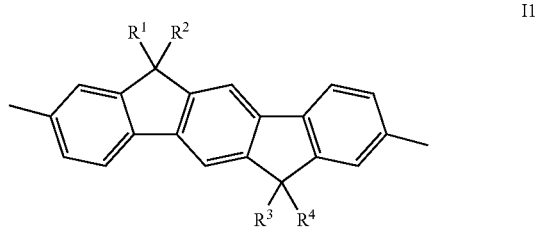

I1

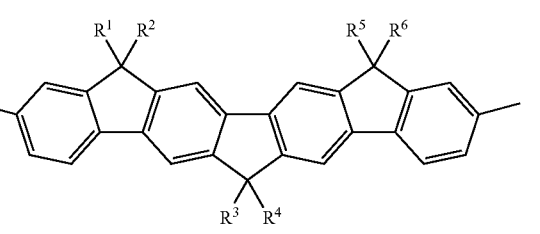

I2

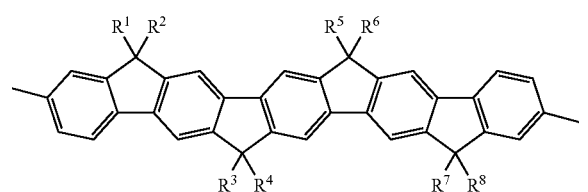

I3

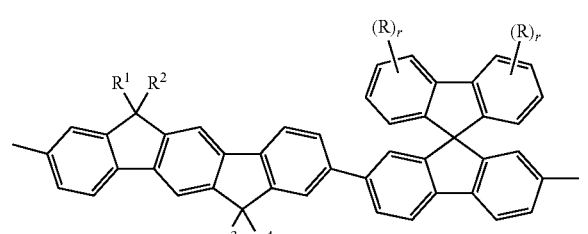

I4

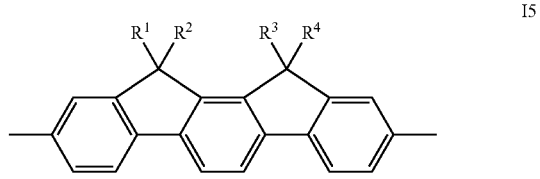

I5

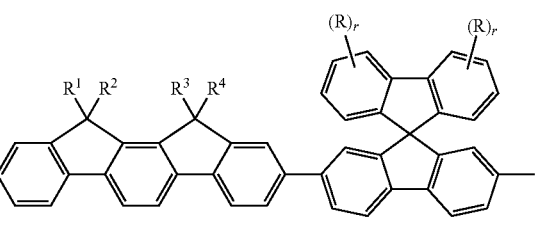

I6

-continued

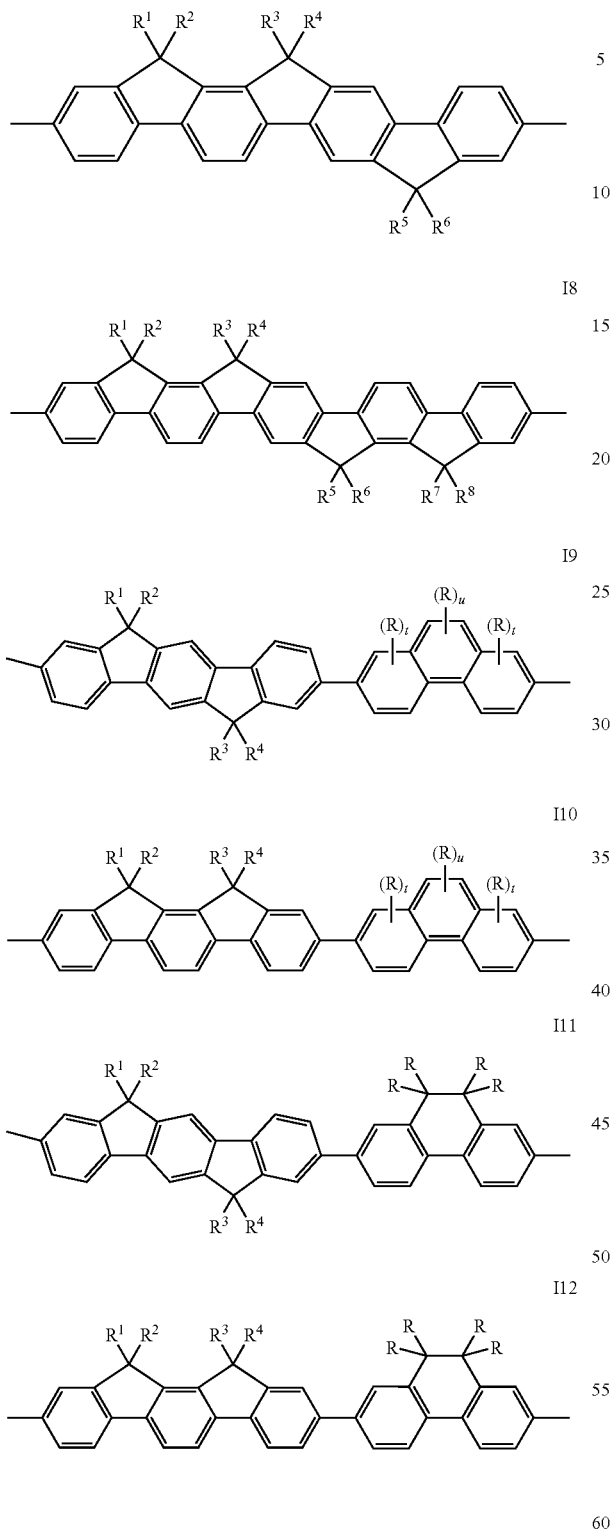

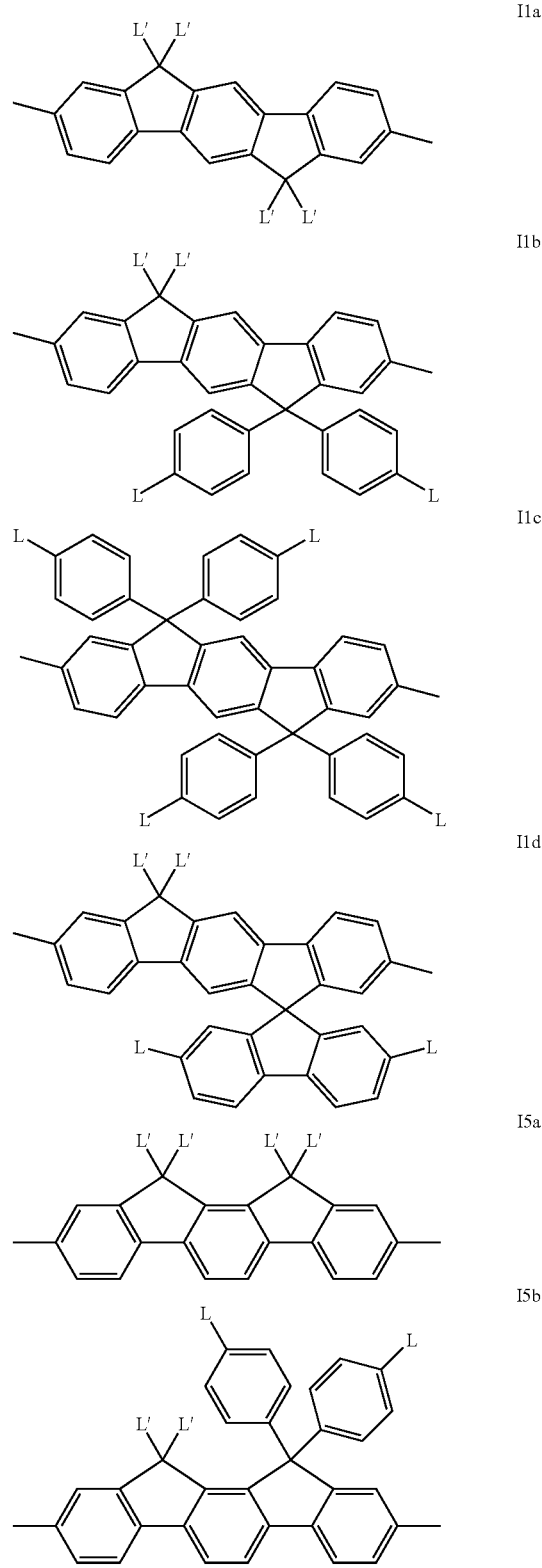

wherein R$^{1-4}$ are as defined in formula I, R and R$^{5-8}$ independently of each other have one of the meanings of R$^1$ given in formula I, r is 0, 1, 2, 3 or 4, t is 0, 1 or 2 and u is 0, 1, 2 or 3.

Particularly preferred units of formula I are selected from the following subformulae:

wherein

L is H, halogen or optionally fluorinated, linear or branched alkyl or alkoxy with 1 to 12 C atoms, and is preferably H, F, methyl, i-propyl, t-butyl, n-pentoxy, or trifluoromethyl, and L' is optionally fluorinated, linear or branched alkyl or alkoxy with 1 to 12 C atoms, and is preferably n-octyl or n-octyloxy.

$Ar^1$ and $Ar^2$ in formula II are preferably selected from 1,4-phenylene wherein one, two or three CH groups are optionally replaced by N, and which are optionally substituted by one or more groups $R^1$ as defined above. Further preferred are units of formula II wherein $Ar^1$ is a single bond.

$Ar^{1-3}$ in formula II is preferably selected from phenyl wherein one, two or three CH groups are optionally replaced by N, and which is optionally substituted by one or more groups $R^1$ as defined above.

k in formula II is very preferably 1.

Y in formula II is very preferably N.

The units of formula II are preferably selected from the following subformulae:

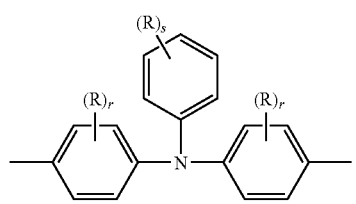

II1

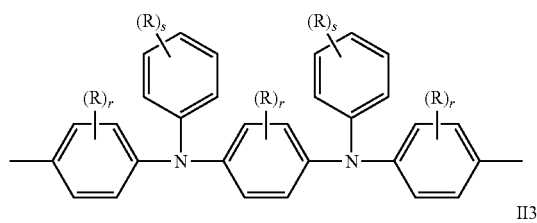

II2

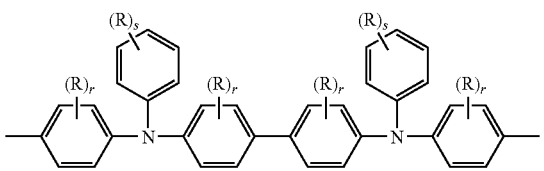

II3 wherein R and r are as defined above and s is 0, 1, 2, 3, 4 or 5.

Particularly preferred units of formula II are selected from the following subformulae:

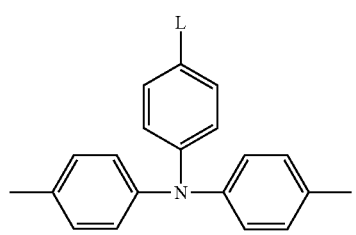

II1a

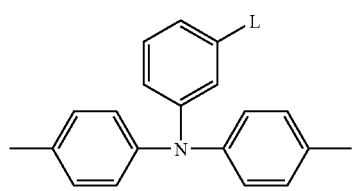

II1b

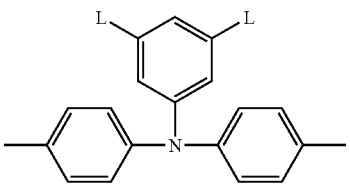

II1c

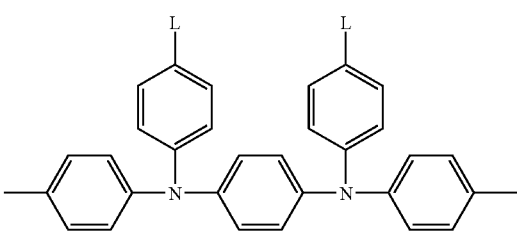

II2a

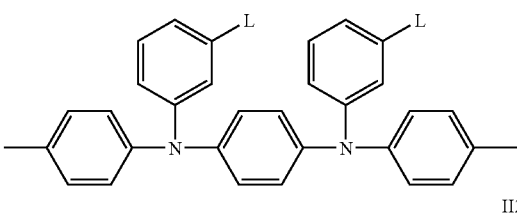

II2b

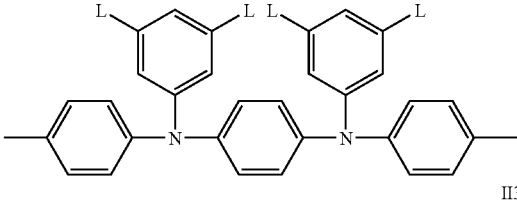

II2c

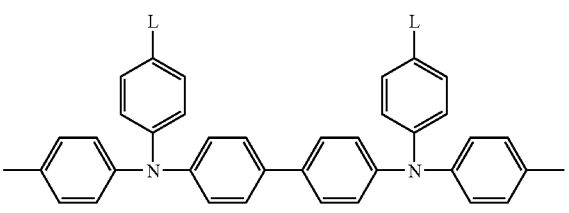

II3a

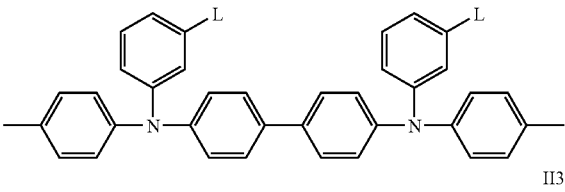

II3b

II3c wherein L and L' are as defined above, L is preferably i-propyl, t-butyl or trifluoromethyl and L' is preferably n-octyl or n-octyloxy.

Preferably the copolymers consist of one or more, preferably one, two or three, most preferably one, type of units of formula I and one or more, preferably one, two or three, most preferably one, type of units of formula II.

The upper limit of the ratio of the units of formula I in the copolymer is preferably ≤99 mol %, more preferably ≤90%. The lower limit of the ratio of the units of formula I in the copolymer is preferably ≥55 mol %, more preferably ≥65 mol %, most preferably ≥75 mol %.

The upper limit of the ratio of the units of formula II in the copolymer is preferably ≤45 mol %, more preferably ≤35 mol %, most preferably ≤25 mol %. The lower limit of the ratio of the units of formula II in the copolymer is preferably ≥1 mol %, most preferably ≥10 mol %.

In addition to the units of formula I and II as disclosed above and below, the copolymers may also comprise one or more, preferably one, additional type of units, preferably selected from units having hole or electron transporting properties.

Additional units having electron transport properties are preferably selected from the following formulae

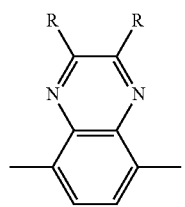

III

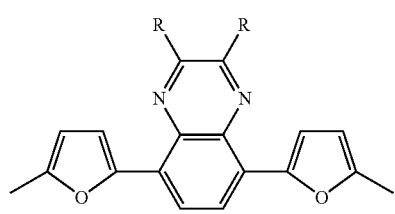

IV

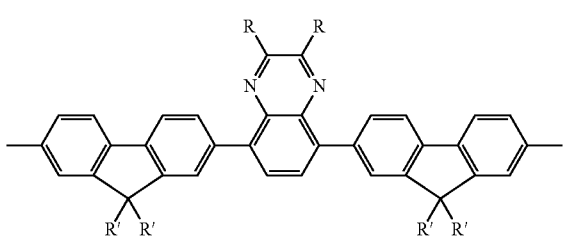

V

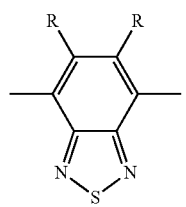

VI

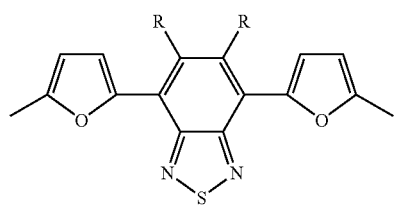

VII

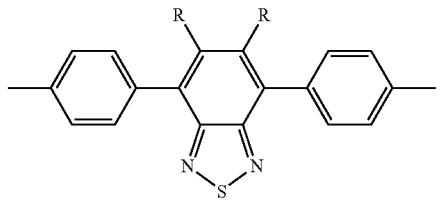

VIII

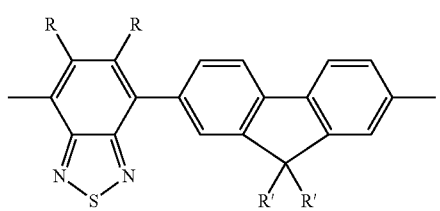

IX wherein R and R' are as defined above, and are preferably H, alkyl, aryl, perfluoroalkyl, thioalkyl, cyano, alkoxy, heteroaryl, alkylaryl or arylalkyl.

R is preferably H, phenyl or alkyl having 1, 2, 3, 4, 5 or 6 C atoms. R' is preferably n-octyl or n-octyloxy.

The copolymers of the present invention include statistical or random copolymers, alternating copolymers and block copolymers, as well as combinations thereof.

Especially preferred are random and block copolymers comprising, very preferably consisting of, >50 mol % of one or more units of formula I and >0 mol % and <50 mol % of one or more units of formula II.

Most preferred are copolymers exclusively consisting of >50 mol % of one type of units of formula I and >0 mol % and <50 mol % of one type of units of formula II.

The copolymers are preferably selected of the following formula

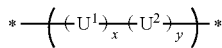

1 wherein $U^1$ is a unit of formula I or its preferred subformulae, $U^2$ is a unit of formula II or its preferred subformulae, x is >0.5 and <1, y is >0 and <0.5, x+y is 1.

Preferred polymers of formula I are selected from the following subformulae

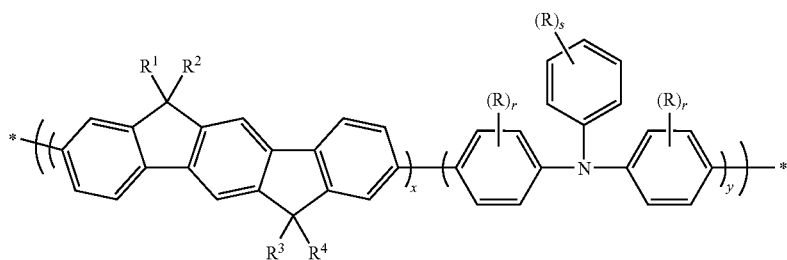

1-1

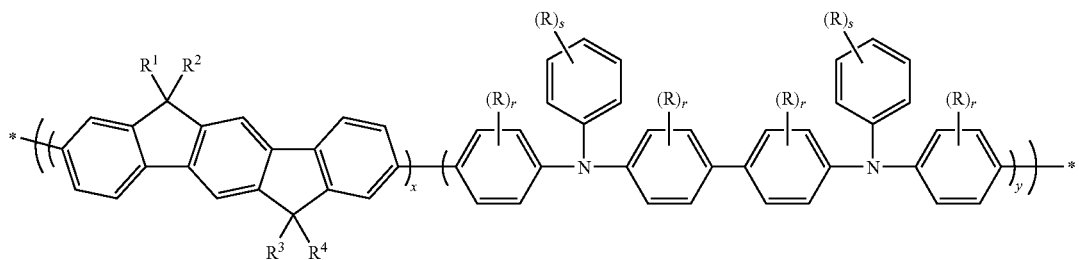

1-2

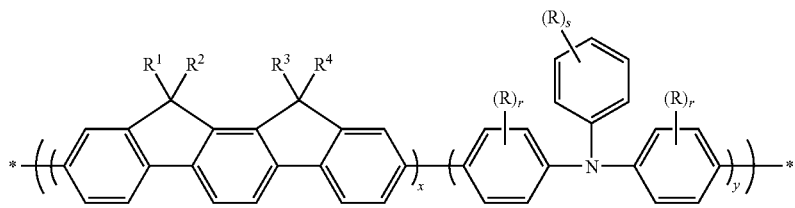

1-3 wherein $R^{1-4}$, R, R', r, s, x and y are as defined above.

In the polymers according to the present invention, the total number of repeating units n is preferably ≥10, very preferably ≥50, and preferably up to 2,000, very preferably up to 5,000, most preferably up to 10,000.

The polymers of the present invention may be prepared by any suitable method. For example, they can be suitably prepared by aryl-aryl coupling reactions, such as Yamamoto coupling, Suzuki coupling, Stille coupling, Sonogashira coupling or Heck coupling. Suzuki coupling and Yamamoto coupling are especially preferred.

The monomers which are polymerised to form the repeat units of the polymers of the present invention can be prepared according to suitable methods which are known to the expert and have been disclosed in the literature. Suitable and preferred methods for the preparation of the indenofluorene monomers of formula I are described for example in WO 2004/041901 A1 and WO 2006/015862 A1. Suitable and preferred methods for the preparation of the triarylamine monomers of formula II, are described for example in WO 99/54385 A1.

Preferably the polymers are prepared from monomers comprising one of the above mentioned groups of formula I-IX, which are linked to two polymerisable groups P. Accordingly, for example indenofluorene and triarylamine monomers selected from the following formulae can be used:

IA

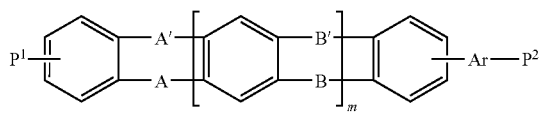

-continued

IIA

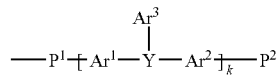

IIA

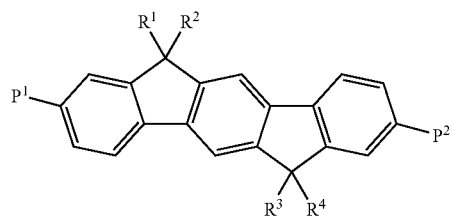

IIIA

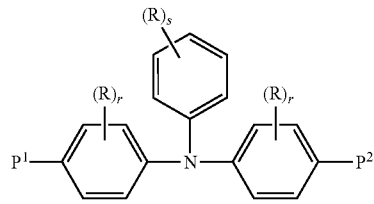

wherein $P^1$ and $P^2$ are independently of each other a polymerisable or reactive group and A, A', B, B', Ar, Y, $Ar^{1-3}$, R, $R^{1-4}$, k, m, r and s are as defined above. The other co-monomers can be built accordingly.

Preferably the groups $P^{1,2}$ are independently of each other selected from Cl, Br, I, O-tosylate, O-triflate, O-mesylate, O-nonaflate, —SiMe$_2$F, —SiMeF$_2$, —O—SO$_2$Z, —B(OZ$^1$)$_2$, —CZ$^2$=C(Z$^2$)$_2$, —C≡CH and —Sn(Z$^3$)$_3$, wherein Z and $Z^{1-3}$ are selected from the group consisting of alkyl and aryl, each being optionally substituted, and two groups $Z^1$ may also form a cyclic group.

Another aspect of the invention is a process for preparing a polymer by coupling one or more monomers based on a unit of formula I with one or more monomers based on a unit of formula II, and optionally with one or more further units, for example selected from formulae III-IX, in a polymerisation reaction.

Preferred methods for polymerisation are those leading to C—C-coupling or C—N-coupling, like Suzuki polymerisation, as described for example in WO 00/53656, Yamamoto polymerisation, as described in for example in T. Yamamoto et al., Progress in Polymer Science 1993, 17, 1153-1205 or in WO 2004/022626 A1, and Stille coupling. For example, when synthesizing a linear polymer by Yamamoto polymerisation, monomers as described above having two reactive halide groups $P^{1,2}$ is preferably used. When synthesizing a linear polymer by Suzuki polymerisation, preferably a monomer as described above is used wherein at least one reactive group $P^{1,2}$ is a boronic acid or boronic acid derivative group.

Suzuki polymerisation may be used to prepare statistical, alternating and block random copolymers. In particular, statistical or block copolymers may be prepared from the above monomers wherein one of the reactive groups $P^1$ and $P^2$ is halogen and the other reactive group is a boronic acid or boronic acid derivative group. The synthesis of statistical, alternating and block copolymers is described in detail for example in WO 03/048225 A2 or WO 2005/014688 A2.

Suzuki polymerisation employs a Pd(0) complex or a Pd(II) salt. Preferred Pd(0) complexes are those bearing at least one phosphine ligand such as $Pd(Ph_3P)_4$. Another preferred phosphine ligand is tris(ortho-tolyl)phosphine, i.e. $Pd(o\text{-}Tol)_4$. Preferred Pd(II) salts include palladium acetate, i.e. $Pd(OAc)_2$. Suzuki polymerisation is performed in the presence of a base, for example sodium carbonate, potassium phosphate or an organic base such as tetraethylammonium carbonate. Yamamoto polymerisation employs a Ni(0) complex, for example bis(1,5-cyclooctadienyl) nickel(0).

As alternatives to halogens as described above, leaving groups of formula —O—$SO_2Z$ can be used wherein Z is as described above. Particular examples of such leaving groups are tosylate, mesylate and triflate.

The organic electronic device is for example an organic field effect transistor (OFET), thin film transistor (TFT), integrated circuit (IC), radio frequency identification (RFID) tag, photodetector, sensor, logic circuit, memory element, capacitor, organic photovoltaic (OPV) cell, charge injection layer, charge transport layer, Schottky diode, planarising layer, antistatic film, polymer electrolyte membrane (PEM), conducting substrate or pattern, photoconductor, electrophotographic element, or organic light emitting diode (OLED).

An OFET device according to the present invention preferably comprises:
 optionally a substrate,
 a gate electrode,
 a dielectric insulating layer,
 a semiconducting layer,
 a source electrode,
 a drain electrode.
wherein the semiconductor layer comprises one or more copolymers as described above and below.

The gate, source and drain electrodes and the insulating and semiconducting layer in the OFET device may be arranged in any sequence, provided that the source and drain electrode are separated from the gate electrode by the insulating layer, the gate electrode and the semiconductor layer both contact the insulating layer, and the source electrode and the drain electrode both contact the semiconducting layer.

Preferably the electronic device is an OFET comprising a dielectric insulating layer, a gate electrode contacting one surface of the dielectric layer, a semiconductor layer contacting the surface of the dielectric layer facing away from the gate electrode, and drain electrode and source electrodes contacting the surface of the semiconductor layer facing away from the dielectric layer.

The OFET is preferably a top gate device or a bottom gate device.

Suitable structures and manufacturing methods of an OFET device are known to the skilled person and are described in the literature, for example in WO 03/052841.

The organic semiconductor layer is preferably less than 30 microns thick. Typically the semiconducting layer is at most 1 micron (=1 μm) thick, although it may be thicker if required. For various electronic device applications, the thickness may also be less than 1 micron. For use in OFETs the layer thickness is typically 500 nm or less, for use in OLEDs typically 100 nm or less. The exact thickness of the layer will depend, for example, upon the requirements of the electronic device in which the layer is used.

Generally the thickness of a functional layer in an electronic device according to the present invention can range from 1 nm (in case of a monolayer) to 10 μm, preferably from 1 nm to 1 μm, more preferably from 1 nm to 500 nm.

The organic semiconductor layer can be deposited by any suitable method. Liquid coating is more desirable than vacuum deposition techniques. Solution deposition methods are especially preferred. Preferred deposition techniques include, without limitation, dip coating, spin coating, ink jet printing, letter-press printing, screen printing, doctor blade coating, roller printing, reverse-roller printing, offset lithography printing, flexographic printing, web printing, spray coating, brush coating or pad printing. Ink-jet printing is particularly preferred.

The organic semiconductor layer is preferably deposited from a formulation, very preferably a solution or a dispersion, comprising the copolymer(s) and one or more organic solvents.

Examples of suitable and preferred organic solvents include, without limitation, dichloromethane, trichloromethane, monochlorobenzene, o-dichlorobenzene, tetrahydrofuran, anisole, morpholine, toluene, o-xylene, m-xylene, p-xylene, 1,4-dioxane, acetone, methylethylketone, 1,2-dichloroethane, 1,1,1-trichloroethane, 1,1,2,2-tetrachloroethane, ethyl acetate, n-butyl acetate, dimethylformamide, dimethylacetamide, dimethylsulfoxide, tetralin, decalin, indane and/or mixtures thereof.

The total concentration of the copolymer(s) in the formulation is preferably 0.1 to 10% by weight, more preferably 0.5 to 5% by weight.

After the appropriate mixing and ageing, solutions are evaluated as one of the following categories: complete solution, borderline solution or insoluble. The contour line is drawn to outline the solubility parameter-hydrogen bonding limits dividing solubility and insolubility. 'Complete' solvents falling within the solubility area can be chosen from literature values such as published in "Crowley, J. D., Teague, G. S. Jr and Lowe, J. W. Jr., Journal of Paint Technology, 38, No 496, 296 (1966)". Solvent blends may also be used and can be identified as described in "Solvents, W. H. Ellis, Federation of Societies for Coatings Technology, p 9-10, 1986". Such a procedure may lead to a blend of 'non' solvents that will dissolve both the polymers of the present invention, although it is desirable to have at least one true solvent in a blend.

The solutions are preferably applied to prefabricated device substrates by ink jet printing or microdispensing. Preferably industrial piezoelectric print heads such as, but not limited to, those supplied by Aprion, Hitachi-Koki, InkJet Technology, On Target Technology, Picojet, Spectra, Trident, Xaar are used. Additionally semi-industrial heads such as those manufactured by Brother, Epson, Konica, Seiko Instruments Toshiba TEC or single nozzle microdispensers such as those produced by Microdrop and Microfab may be used.

Suitable solvents for ink jet printing or microdispensing must fulfil the requirements stated above and must not have any detrimental effect on the chosen print head. Additionally, solvents should have boiling points >100° C., preferably >140° C. and more preferably >150° C. in order to prevent operability problems caused by the solution drying out inside the print head. Apart from the solvents mentioned above, suitable solvents include substituted and non-substituted xylene derivatives, di-$C_{1-2}$-alkyl formamide, substituted and non-substituted anisoles and other phenol-ether derivatives, substituted heterocycles such as substituted pyridines, pyrazines, pyrimidines, pyrrolidinones, substituted and non-substituted N,N-di-$C_{1-2}$-alkylanilines and other fluorinated or chlorinated aromatics.

A preferred solvent for depositing copolymers according to the present invention by ink jet printing comprises a benzene derivative which has a benzene ring substituted by one or more substituents wherein the total number of carbon atoms among the one or more substituents is at least three. For example, the benzene derivative may be substituted with a propyl group or three methyl groups, in either case there being at least three carbon atoms in total. Such a solvent enables an ink jet fluid to be formed comprising the solvent with the polymer, which reduces or prevents clogging of the jets and separation of the components during spraying. The solvent(s) may include those selected from the following list of examples: dodecylbenzene, 1-methyl-4-tert-butylbenzene, terpineol limonene, isodurene, terpinolene, cymene, diethylbenzene. The solvent may be a solvent mixture, that is a combination of two or more solvents, each solvent preferably having a boiling point >100° C., more preferably >140° C. Such solvent(s) also enhance film formation in the layer deposited and reduce defects in the layer.

The ink jet fluid (that is mixture of solvent, binder and semiconducting compound) preferably has a viscosity at 20° C. of 1-100 mPa·s, more preferably 1-50 mPa·s and most preferably 1-30 mPa·s.

The organic semiconductor formulation can additionally comprise one or more further components like for example surface-active compounds, lubricating agents, wetting agents, dispersing agents, hydrophobing agents, adhesive agents, flow improvers, defoaming agents, deaerators, diluents which may be reactive or non-reactive, auxiliaries, colourants, dyes or pigments, sensitizers, stabilizers, nanoparticles or inhibitors.

In another preferred embodiment of the present invention, the organic semiconductor layer or the formulation for its deposition comprises one or more organic binders to adjust its rheological properties, as described for example in WO 2005/055248 A1.

The other components of the electronic device, like the substrate, the dielectric layer and the electrodes, can be selected from standard materials, and can be manufactured and applied to the device by standard methods. Suitable materials and manufacturing methods for these components and layers are known to the skilled person and are described in the literature.

The deposition methods include liquid coating and vapour or vacuum deposition. Preferred deposition techniques include, without limitation, dip coating, spin coating, ink jet printing, letter-press printing, screen printing, doctor blade coating, roller printing, reverse-roller printing, offset lithography printing, flexographic printing, web printing, spray coating, brush coating or pad printing. Ink-jet printing is particularly preferred as it allows high resolution layers and devices to be prepared.

Various substrates may be used for the fabrication of organic electronic devices, for example glass or plastics, plastics materials being preferred, examples including alkyd resins, allyl esters, benzocyclobutenes, butadiene-styrene, cellulose, cellulose acetate, epoxide, epoxy polymers, ethylene-chlorotrifluoro ethylene, ethylene-tetra-fluoroethylene, fibre glass enhanced plastic, fluorocarbon polymers, hexafluoro-propylenevinylidene-fluoride copolymer, high density polyethylene, parylene, polyamide, polyimide, polyaramid, polydimethylsiloxane, polyethersulphone, poly-ethylene, polyethylenenaphthalate, polyethyleneterephthalate, polyketone, polymethylmethacrylate, polypropylene, polystyrene, polysulphone, polytetrafluoroethylene, polyurethanes, polyvinylchloride, silicone rubbers, silicones. Preferred substrate materials are polyethyleneterephthalate, polyimide, and polyethylenenaphthalate. The substrate may be any plastic material, metal or glass coated with the above materials. The substrate should preferably be homogenous to ensure good pattern definition. The substrate may also be uniformly pre-aligned by extruding, stretching, rubbing or by photochemical techniques to induce the orientation of the organic semiconductor in order to enhance carrier mobility.

The electrodes can be deposited by liquid coating, such as spray-, dip-, web- or spin-coating, or by vacuum deposition or vapour deposition methods. Suitable electrode materials and deposition methods are known to the person skilled in the art. Suitable electrode materials include, without limitation, inorganic or organic materials, or composites of the two.

Examples for suitable electrode materials include polyaniline, polypyrrole, PEDOT or doped conjugated polymers, further dispersions or pastes of graphite or particles of metal such as Au, Ag, Cu, Al, Ni or their mixtures as well as sputtercoated or evaporated metals, like e.g. Cu, Cr, Pt/Pd etc., and semiconductors like e.g. ITO. Organometallic precursors may also be used deposited from a liquid phase.

The dielectric material for the insulator layer may be inorganic or organic or a composite of the two. It is preferred that the insulator is solution coated which allows ambient processing, but could be also deposited by various vacuum deposition techniques. When the insulator is being patterned, it may perform the function of interlayer insulation or act as gate insulator for an OFET. Preferred deposition techniques include, without limitation, dip coating, spin coating, ink jet printing, letter-press printing, screen printing, doctor blade coating, roller printing, reverse-roller printing, offset lithography printing, flexographic printing, web printing, spray coating, brush coating or pad printing. Ink-jet printing is particularly preferred as it allows high resolution layers and devices to be prepared. Optionally, the dielectric material could be cross-linked or cured to achieve better resitivity against solvents and/or structural integrity and/or to enable patternability (photolithography) Preferred gate insulators are those that provide a low permittivity interface to the OSC.

Suitable and preferred organic dielectric materials include, without limitation, fluorinated para-xylene, fluoropolyarylether, fluorinated polyimide polystyrene, poly($\alpha$-methylstyrene), poly($\alpha$-vinylnaphtalene), poly(vinyltoluene), polyethylene, cis-polybutadiene, polypropylene, polyisoprene, poly(4-methyl-1-pentene), poly(4-methylstyrene), poly(chorotrifluoroethylene), poly(2-methyl-1,3-butadiene), poly(p-xylylene), poly(α-α-α'-α' tetrafluoro-p-xylylene), poly[1,1-(2-methyl propane)bis(4-phenyl)carbonate], poly(cyclohexyl methacrylate), poly(chlorostyrene), poly(2,6-dimethyl-1,4-phenylene ether), polyisobutylene, poly(vinyl cyclohexane), poly(vinylcinnamate), poly(4-vinylbiphenyl), poly(1,3-butadiene), polyphenylene. Further preferred are copolymers, including regular, random or block copolymers like poly(ethylene/tetrafluoroethylene), poly(ethylene/chlorotrifluoro-ethylene), fluorinated ethylene/propylene copolymer, polystyrene-co-α-methylstyrene, ethylene/ethyl acrylate copolymer, poly(styrene/10% butadiene), poly(styrene/15% butadiene), poly(styrene/2,4 dimethylstyrene). Further preferred are polymers from the commercially available Topas® series (Ticona), polycycloolefins like those from the commercially available Avatrel® series (Promerus LLC) and highly soluble perfluoropolymers like those from the commercially available Cytop® series (Asahi Glass) or TeflonAF® series (DuPont).

For specific devices it may be preferably to use a dielectric material with a high permittivity. Suitable and preferred organic dielectric materials of this type include, without limitation, for example, polyvinylalcohol, polyvinylphenol, polymethylmethacrylate, cyanoethylated polysaccharides such as cyanoethylpullulane, high permittivity fluoropolymers such as polyvinylidenefluoride, polyurethane polymers and poly(vinyl chloride/vinylacetate) polymers. Suitable and preferred inorganic dielectric materials of this type include, without limitation, for example composites of $TiO_2$, $Ta_2O_5$, $SrTiO_3$, $Bi_4Ti_3O_{12}$, $BaMgF_4$, barium zirconium titanate or barium strontium titanate.

In a preferred embodiment of the present invention the insulator layer comprises, or consists of, an organic dielectric material having a low permittivity, preferably having a relative permittivity from 1.1 to below 3.0, as disclosed for example in WO 03/052841. Suitable and preferred materials for this embodiment include, without limitation, polypropylene, polyisobutylene, poly(4-methyl-1-pentene), polyisoprene, poly(vinyl cyclohexane), or a copolymer containing the monomer units of at least one of these materials, polycycloolefins like those from the Avatrel® series and fluoropolymers, in particular those from the Cytop® or TeflonAF® series.

Preferably the insulator layer comprises a fluoropolymer, like e.g. the commercially available Cytop 809M® or Cytop 107M® (from Asahi Glass). Preferably the gate insulator layer is deposited, e.g. by spin-coating, doctor blading, wire bar coating, spray or dip coating or other known methods, from a formulation comprising an insulator material and one or more solvents with one or more fluoro atoms (fluorosolvents), preferably a perfluorosolvent. A suitable perfluorosolvent is e.g. FC75® (available from Acros, catalogue number 12380). Other suitable fluoropolymers and fluorosolvents are known in prior art, like for example the perfluoropolymers Teflon AF® 1600 or 2400 (from DuPont) or Fluoropel® (from Cytonix) or the perfluorosolvent FC 43® (Acros, No. 12377).

Further preferred is an integrated circuit comprising a field effect transistor according to the present invention.

Further preferred is a photovoltaic cell comprising one or more copolymers as described above and below.

An OPV device according to the present invention preferably comprises:
a low work function electrode (for example Aluminum), a high work function electrode (for example ITO), one of which is transparent,
a bilayer of consisting of a hole transporting and an electron transporting material; the bilayer can exist as two distinct layers, or a blended mixture (see for example Coakley, K. M. and McGehee, M. D. Chem. Mater. 2004, 16, 4533),
an optional conducting polymer layer (such as for example PEDOT:PSS) to modify the work function of the high work function electrode to provide an ohmic contact for the hole,
an optional coating on the high work function electrode (such as LiF) to provide an ohmic contact for electrons.

The hole transporting material in the blend exists of one of the copolymers as described above and below. The electron transporting material can be an inorganic material such as zinc oxide or cadmium selenide, or an organic material such as a fullerene derivate (for example PCBM, [(6,6)-phenyl C61-butyric acid methyl ester] or a polymer see for example Coakley, K. M. and McGehee, M. D. Chem. Mater. 2004, 16, 4533). If the bilayer is a blend an optional annealing step may be necessary to optimize device performance.

Unless the context clearly indicates otherwise, as used herein plural forms of the terms herein are to be construed as including the singular form and vice versa.

Throughout the description and claims of this specification, the words "comprise" and "contain" and variations of the words, for example "comprising" and "comprises", mean "including but not limited to", and are not intended to (and do not) exclude other components.

It will be appreciated that variations to the foregoing embodiments of the invention can be made while still falling within the scope of the invention. Each feature disclosed in this specification, unless stated otherwise, may be replaced by alternative features serving the same, equivalent or similar purpose. Thus, unless stated otherwise, each feature disclosed is one example only of a generic series of equivalent or similar features.

All of the features disclosed in this specification may be combined in any combination, except combinations where at least some of such features and/or steps are mutually exclusive. In particular, the preferred features of the invention are applicable to all aspects of the invention and may be used in any combination. Likewise, features described in non-essential combinations may be used separately (not in combination).

It will be appreciated that many of the features described above, particularly of the preferred embodiments, are inventive in their own right and not just as part of an embodiment of the present invention. Independent protection may be sought for these features in addition to or alternative to any invention presently claimed.

The examples below serve to illustrate the invention without limiting it. In the foregoing and the following, all temperatures are given in degrees Celsius, and all percentages are by weight, unless stated otherwise.

EXAMPLE 1

Poly[{N,N-bis(4-phenyl)-N-(4-sec-butylphenyl)amine}-co-{2,8-(6,6',12,12'-tetraoctyl-6,12-dihydroindeno-[1,2b]fluorene)}], 30% M1: 70% M2, is prepared as follows:

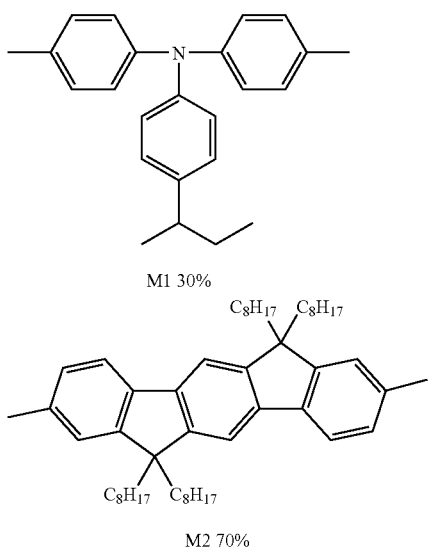

M1 30%

M2 70%

To a 1000 cm³ RBF, equipped with mechanical stirrer and reflux condenser under $N_2$ is added N,N-bis[4-(4,4,5,5-tetramethyl-1,3,2-dioxaborolan-2-0)phenyl]-N-(4-sec-butylphenyl)amine (2.70 g, 4.88 mmol), 2,8-bis(4,4,5,5-tetramethyl-1,3,2-dioxaborolan-2-yl)-6,6'12,12'-tetraoctyl-6,12-dihydroindeno-[1,2b]fluorene (3.11 g, 325 mmol), 2,8-dibromo-6,6'12,12'-tetraoctyl-6,12-dihydroindeno-[1,2b]fluorene (7.00 g, 8.13 mmol), potassium phosphate monohydrate (8.24 g, 35.78 mmol) and tolyl boronate ester (9.9 mg, 0.061 mmol). To this is added degassed ($N_2$) toluene (81 cm³), degassed 1,4-dioxane (81 cm³) and degassed HPLC water (81 cm³). The cloudy mixture is then degassed (stirred, bubbling $N_2$) for 1 hour. Meanwhile, the oil bath is pre-heated to 105° C. and a stock solution of catalyst is prepared [4.5 times the quantity required: palladium(II) acetate (32.9 mg, 0.147 mmol) and tri(o-tolyl)phosphine (267.3 mg, 0.878 mmol) in degassed 1,4-dioxane (15.8 cm³), which is degassed for 50 minutes in a sealed vial]. After the reaction mixture is degassed, the degassing glass tube is washed with 1,4-dioxane (6 cm³) and toluene (6 cm³) and then the flask is lowered into the preheated oil bath at 105° C. and after 10 minutes, the catalyst solution (3.5 cm³) is added. The reaction mixture is then stirred vigorously for 2 hours in the dark. Tolyl boronate ester (31.3 mg, 0.193 mmol) is added followed by further catalyst solution (3.5 cm³) and the mixture heated at 105° C. for 1 hour. After cooling down to 65° C., sodium diethyldithiocarbamate trihydrate (81 cm³, 10% by weight) and toluene (81 cm³) are added and the mixture is stirred at 65° C. for 2 hours. After allowing to cool to 23° C. overnight, the reaction mixture is poured into a separating funnel and toluene (200 cm³) is added. The organic layer is washed with water (3×500 cm³) and the organic layer separated and precipitated into methanol. The polymer was collected by filtration and then dried under vacuum. The polymer is dissolved in toluene (200 cm³) and filtered through a pad of celite with hot toluene. The polymer solution is precipitated from stirred methanol (1200 cm³) and the polymer is collected by filtration, washed with methanol and dried under vacuum to yield the product as a pale yellow solid (7.71 g, 80%). GPC (PhCl at 60° C.): $M_n$=99,000 g mol⁻¹; $M_w$=208,100 g⁻¹.

EXAMPLE 2

A field effect transistor is prepared as follows: On a glass substrate patterned Au source and drain electrodes are provided by shadow masking. A self assembling monolayer of pentafluorobenzene-thiol (electrode injection layer) is spin-coated onto the Au electrodes and washed with IPA. A semiconductor formulation is prepared by dissolving Example 1 in a concentration of 1 wt. % in mesitylene. The semiconductor solution is then spincoated onto the substrate at 5.00 rpm for 3 seconds followed by 2000 rpm for 30 s at room temperature in air and the solvent is evaporated. The insulator material (Cytop® 809M, available from Asahi Glass) is then spincoated onto the semiconductor giving a thickness of approximately 1 μm and the solvent is evaporated. A gold gate contact is defined over the device channel area by evaporation through a shadow mask.

For the electrical measurements the transistor sample is mounted in a sample holder. Microprobe connections were made to the gate, drain and source electrodes using Karl Suss PH100 miniature probe-heads. These are linked to a Hewlett-Packard 4155E parameter analyser. The drain voltage is set to −5 V and the gate voltage is scanned from +20 to −60 V and back to +20 V in 1 V steps. The $I_{SD}$ (source-drain current) vs. $V_G$ (gate voltage) characteristic is shown in FIG. 1.

The field effect mobility values are calculated from the gradient of the $I_{SD}$ vs. $V_G$ characteristic in the linear regime (Lin mob) and the saturation regime (Sat mob). All measurements are performed in air at room temperature. The results are summarized below:

Lin mob=0.011 cm²/Vs

Sat mob=0.015 cm²/Vs

The invention claimed is:
1. A conjugated copolymer comprising >50 mol % and ≤90 mol % of one or more identical or different units of formula I

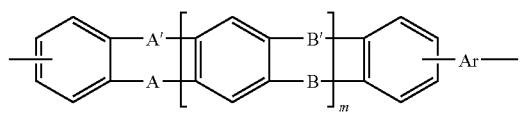

and >0 mol % and <50 mol % of one or more identical or different units of formula II

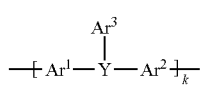

wherein
one of A and A' is a single bond and the other is $CR^1R^2$,
one of B and B' is a single bond and the other is $CR^3R^4$,
$R^{1-4}$ are independently of each other identical or different groups selected from H, halogen, —CN, —NC, —NCO, —NCS, —OCN, —SCN, —C(=O)NR°R°°, —C(=O)X, —C(=O)R°, —NH₂, —NR°R°°, —SH, —SR°, —SO₃H, —SO₂R°, —OH, —NO₂, —CF₃, —SF₅, optionally substituted silyl, or a straight-chain, branched or cyclic alkyl with 1 to 40 C-atoms which is unsubstituted or mono- or polysubstituted by F, Cl, Br, I or CN, and wherein one or more non-adjacent CH₂ groups are each optionally replaced, independently from one another, by —O—, —S—, —NH—, —NR°—, —SiR°R°°—, —CO—, —COO—, —OCO—, —O—CO—O—, —S—CO—, —CO—S—, —SO$_2$—, —CO—NR$^0$—, —NR$^0$—CO—, —NR$^0$—CO—NR$^{00}$—, —CY$^1$=CY$^2$— or —C≡C— in such a manner that O and/or S atoms are not linked directly to one another, Y$^1$ and Y$^2$ are independently of each other H, F, Cl or CN, X is halogen, R$^0$ and R$^{00}$ are independently of each other H or an optionally substituted carbyl or hydrocarbyl group optionally comprising one or more hetero atoms, Ar is a single bond or denotes mononuclear or polynuclear aryl or heterorayl, m is 1, Y is N, P, P=O, PF$_2$, P=S, As, As=O, As=S, Sb, Sb=O or Sb=S, Ar$^1$ which may be the same or different, denote, independently if in different repeat units, a single bond or an optionally substituted mononuclear or polynuclear aryl group, Ar$^2$ which may be the same or different, denote, independently if in different repeat units, an optionally substituted mononuclear or polynuclear aryl group, Ar$^3$ which may be the same or different, denote, independently if in different repeat units, an optionally substituted mononuclear or polynuclear aryl group, which may be optionally substituted by a bridging group linking different chain residues of formula II, and k is 1, 2 or 3, and R$^4$ wherein optionally the groups R$^1$ and R$^2$ and/or the groups R$^3$ and R$^4$ together with the adjacent fluorene moiety form a spiro group.

2. The conjugated copolymer according to claim 1, wherein the units of formula I are selected from the following subformulae

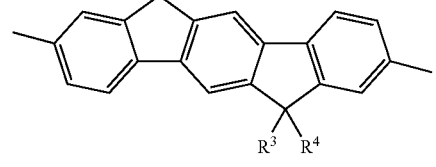

I1

I2

I3

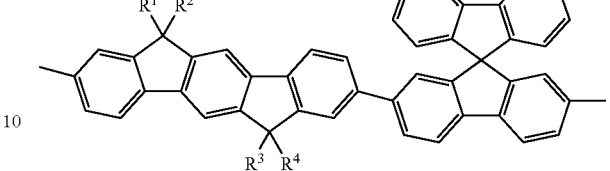

I4

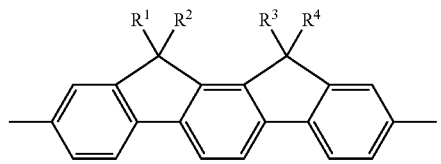

I5

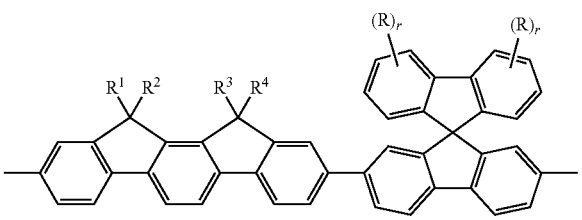

I6

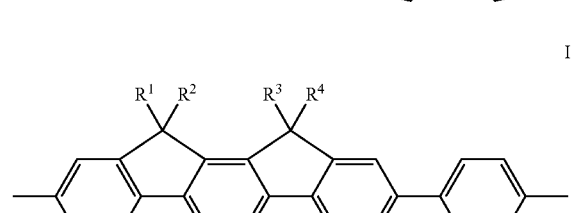

I7

I8

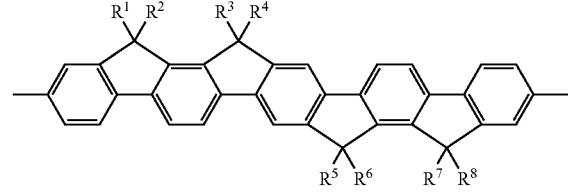

I9

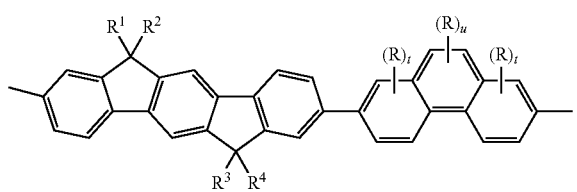

I10

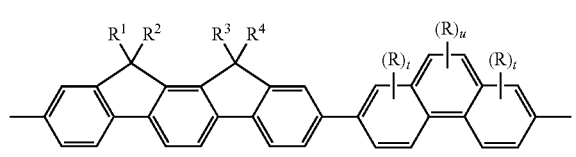

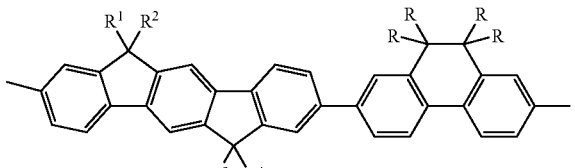

I11

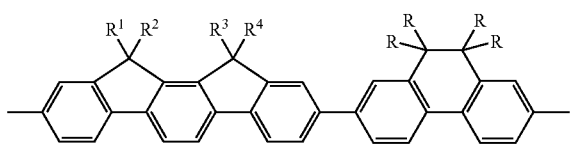

I12

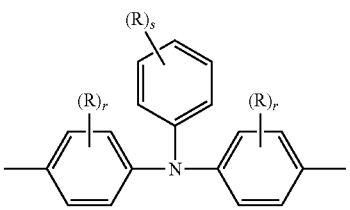

II1

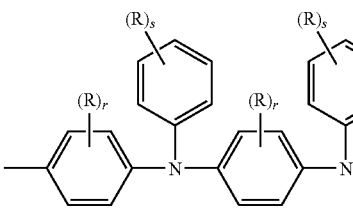

II2

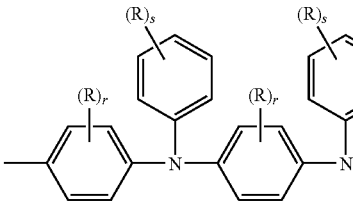

II3

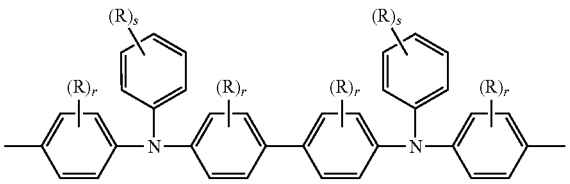

wherein $R^{1-4}$ are as defined,

R and $R^{5-8}$ are independently of each other identical or different groups selected from H, halogen, —CN, —NC, —NCO, —NCS, —OCN, —SCN, —C(=O)NR°R°°, —C(=O)X, —C(=O)R°, —NH$_2$, —NR°R°°, —SH, —SR°, —SO$_3$H, —SO$_2$R°, —OH, —NO$_2$, —CF$_3$, —SF$_5$, optionally substituted silyl, or carbyl or hydrocarbyl with 1 to 40 C atoms that is optionally substituted and optionally comprises one or more hetero atoms, r is 0, 1, 2, 3 or 4, t is 0, 1 or 2, and u is 0, 1, 2 or 3.

3. The conjugated copolymer according to claim 1, wherein the units of formula I are selected from the following subformulae

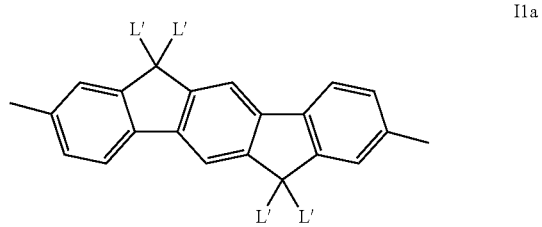

I1a

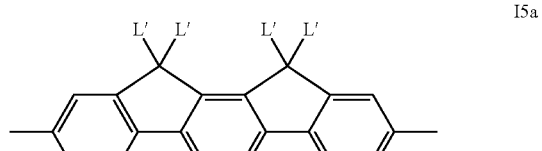

I5a wherein

L' is optionally fluorinated, linear or branched alkyl or alkoxy with 1 to 12 C atoms.

4. The conjugated copolymer according to claim 1, wherein units of formula II are selected from the following subformulae wherein R is selected from H, halogen, —CN, —NC, —NCO, —NCS, —OCN, —SCN, —C(=O)NR°R°°, —C(=O)X, —C(=O)R°, —NH$_2$, —NR°R°°, —SH, —SR°, —SO$_3$H, —SO$_2$R°, —OH, —NO$_2$, —CF$_3$, —SF$_5$, optionally substituted silyl, or carbyl or hydrocarbyl with 1 to 40 C atoms that is optionally substituted and optionally comprises one or more hetero atoms, r is 0, 1, 2, 3 or 4, and s is 0, 1, 2, 3, 4 or 5.

5. The conjugated copolymer according to claim 1, wherein the units of formula II are selected from the following subformulae

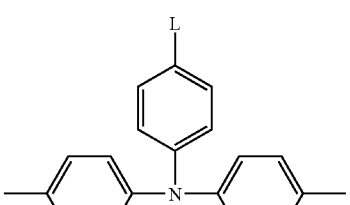

II1a

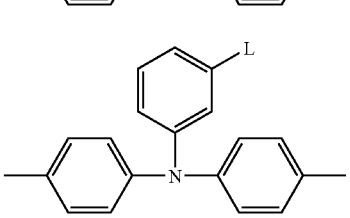

II1b

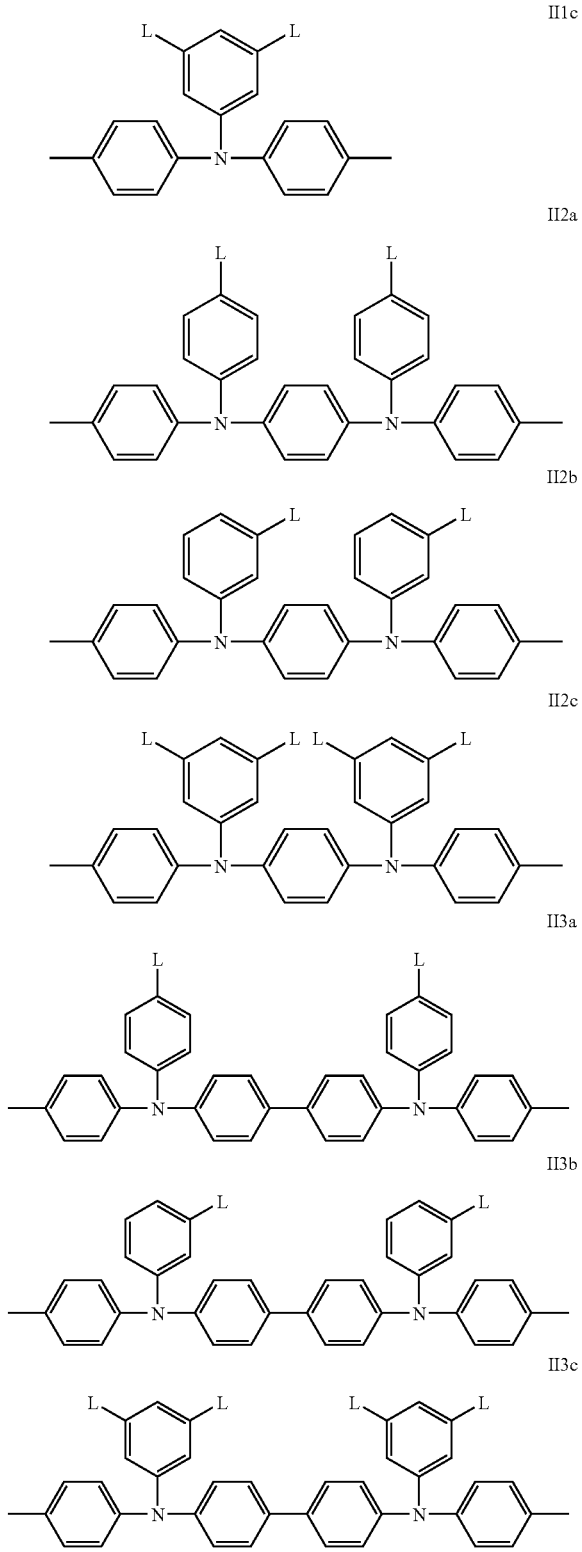

wherein

L is H, halogen or optionally fluorinated, linear or branched alkyl or alkoxy with 1 to 12 C atoms, and L' is optionally fluorinated, linear or branched alkyl or alkoxy with 1 to 12 C atoms.

6. The conjugated copolymer according to claim 1, wherein the upper limit of the ratio of the units of formula I is ≤90 mol % and the lower limit of the ratio of the units of formula I is ≥55 mol %.

7. The conjugated copolymer according to claim 1, wherein the upper limit of the ratio of the units of formula II is ≤45 mol %, and the lower limit of the ratio of the units of formula II is ≥10 mol %.

8. The conjugated copolymer according to claim 1, wherein said copolymer exclusively consists of >50 mol % of one type of units of formula I and >0 mol % and <50 mol % of one type of units of formula II.

9. An organic electronic device comprising a copolymer according to claim 1.

10. The organic electronic device according to claim 9, which is an organic field effect transistor (OFET), thin film transistor (TFT), integrated circuit (IC), radio frequency identification (RFID) tag, photodetector, sensor, logic circuit, memory element, capacitor, organic photovoltaic (OPV) cell, charge injection layer, charge transport layer or interlayer in polymer light emitting diodes (PLEDs), Schottky diode, planarising layer, antistatic film, polymer electrolyte membrane (PEM), conducting substrate or pattern, photoconductor, electrophotographic element or organic light emitting diode (OLED).

11. The conjugated copolymer according to claim 3, wherein L is H, F, methyl, i-propyl, t-butyl, n-pentoxy, or trifluoromethyl, and L' is n-octyl or n-octyloxy.

12. The conjugated copolymer according to claim 5, wherein L is H, F, methyl, i-propyl, t-butyl, n-pentoxy, or trifluoromethyl, and L' is n-octyl or n-octyloxy.

13. The conjugated copolymer according to claim 1, wherein Ar is a single bond, optionally substituted indenofluorene, optionally substituted spirobifluorene, optionally substituted 9,10-dihydrophenanthrene or optionally substituted phenanthrene.

14. The conjugated copolymer according to claim 1, wherein A' is $CR^1R^2$, B is $CR^3R^4$, Ar is a single bond, and m is 1.

15. The conjugated copolymer according to claim 1, wherein A' is $CR^1R^2$, B' is $CR^3R^4$, Ar is a single bond, and m is 1.

16. The conjugated copolymer according to claim 1, wherein $Ar^1$ is a single bond or 1,4-phenylene wherein one, two or three CH groups are optionally replaced by N, and which are optionally substituted by one or more groups $R^1$, and $Ar^2$ is selected from 1,4-phenylene wherein one, two or three CH groups are optionally replaced by N, and which are optionally substituted by one or more groups $R^1$.

17. The conjugated copolymer according to claim 1, wherein $Ar^{1-3}$ are each independently phenyl wherein one, two or three CH groups are optionally replaced by N, and which is optionally substituted by one or more groups $R^1$.

18. The conjugated copolymer according to claim 1, wherein k is 1.

19. The conjugated copolymer according to claim 1, wherein Y is N.

20. The conjugated copolymer according to claim 1, wherein $R^0$ and $R^{00}$ are each selected from H, straight-chain or branched alkyl with 1 to 12 C atoms or aryl with 6 to 12 C atoms, and —$CY^1$=$CY^2$— is —CH=CH—, —CF=CF— or —CH=C(CN)—.

21. The conjugated copolymer according to claim 1, wherein Ar is either a single bond or an optionally substituted mononuclear or polynuclear aryl group.

22. The conjugated copolymer according to claim 1, wherein Ar is optionally substituted indenofluorene, optionally substituted spirobifluorene, optionally substituted 9,10-dihydrophenanthrene or optionally substituted phenanthrene.

23. The conjugated copolymer according to claim 1, wherein Ar¹ and Ar² are each independently selected from 1,4-phenylene wherein one, two or three CH groups are each optionally replaced by N, and which are each optionally substituted by one or more groups R¹.

24. The conjugated copolymer according to claim 1, wherein Ar¹ is a single bond.

25. The conjugated copolymer according to claim 1, wherein Ar¹⁻³ is phenyl wherein one, two or three CH groups are each optionally replaced by N, and which is optionally substituted by one or more groups R¹.

26. The conjugated copolymer according to claim 1, wherein the upper limit of the ratio of the units of formula I is ≤90% and the lower limit of the ratio of the units of formula I is ≥65 mol %, and upper limit of the ratio of the units of formula II is ≤35 mol %, and the lower limit of the ratio of the units of formula II is ≥10 mol %.

27. The conjugated copolymer according to claim 1, wherein, in addition to the units of formula I and II, said copolymers further comprises one or more additional type of units selected from units of the following formulae

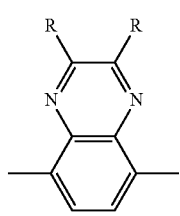

III

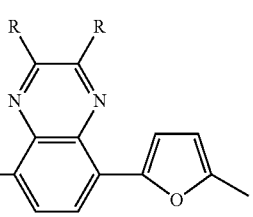

IV

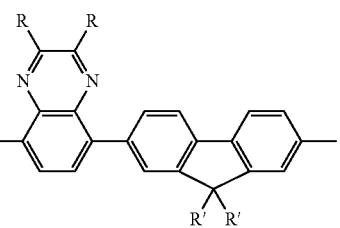

V

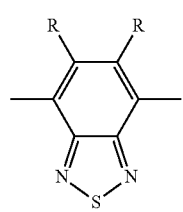

VI

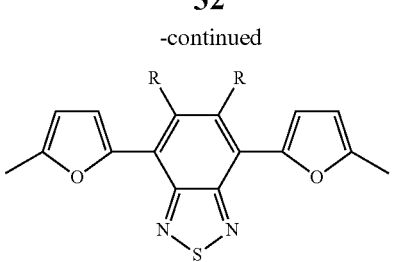

VII

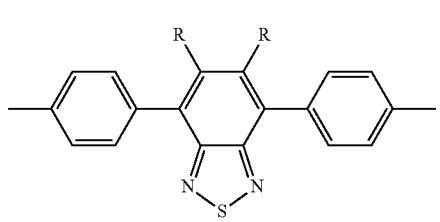

VIII

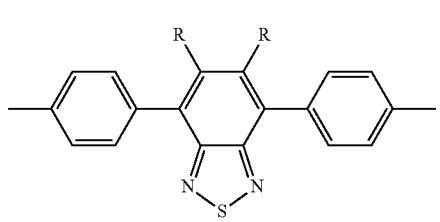

IX wherein R and R' are each independently H, alkyl, aryl, perfluoroalkyl, thioalkyl, cyano, alkoxy, heteroaryl, alkylaryl or arylalkyl.

28. The conjugated copolymer according to claim 27, wherein R is H, phenyl or alkyl having 1, 2, 3, 4, 5 or 6 C atoms, and R' is n-octyl or n-octyloxy.

29. The conjugated copolymer according to claim 1, wherein said copolymer is of the following formula

1 wherein
    U¹ is a unit of formula I,
    U² is a unit of formula II,
    x is >0.5 and <1,
    y is >0 and <0.5, and
    x+y is 1.

30. The conjugated copolymer according to claim 24, wherein said copolymer is selected from the following sub-formulae

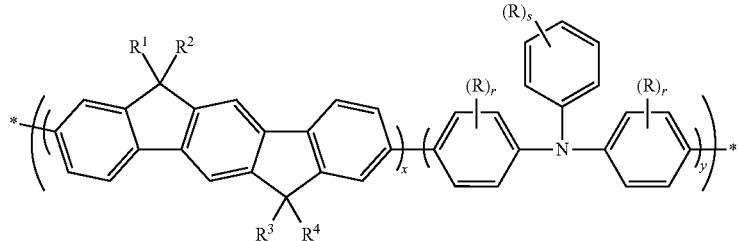

1-1

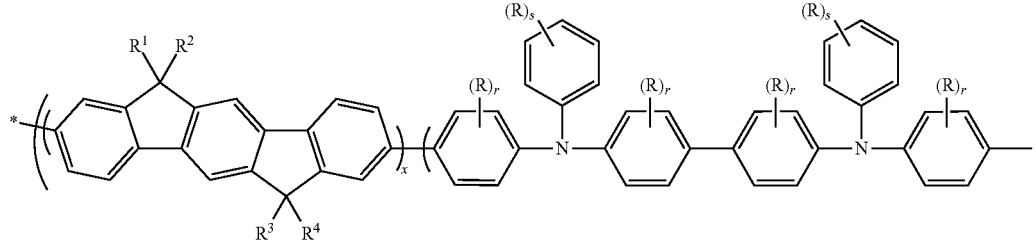

1-2

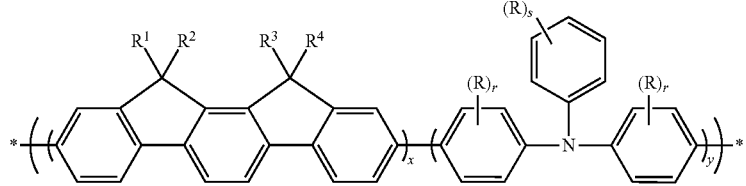

1-3 wherein
R and R' are each independently H, alkyl, aryl, perfluoroalkyl, thioalkyl, cyano, alkoxy, heteroaryl, alkylaryl or arylalkyl,
r is 0, 1, 2, 3 or 4, and
s is 0, 1, 2, 3, 4 or 5.

31. The conjugated copolymer according to claim 1, wherein the total number of repeating units n is 10 to 10,000.

32. The organic electronic device according to claim 9, wherein said device is an organic field effect transistor comprising:

an optional substrate,
a gate electrode,
a dielectric insulating layer,
a semiconducting layer,
a source electrode, and
a drain electrode,
wherein said semiconductor layer comprises said copolymer.

33. The conjugated copolymer according to claim 2, wherein the units of formula I are of subformulae I1.

* * * * *

UNITED STATES PATENT AND TRADEMARK OFFICE
CERTIFICATE OF CORRECTION

PATENT NO. : 8,586,684 B2
APPLICATION NO. : 12/743673
DATED : November 19, 2013
INVENTOR(S) : Michael Heckmeier et al.

Page 1 of 1

It is certified that error appears in the above-identified patent and that said Letters Patent is hereby corrected as shown below:

In the Claims

Column 25, Line 32 reads: "$R^4$ wherein optionally the groups $R^1$ and $R^2$ and/or the" should read --wherein optionally the groups $R^1$ and $R^2$ and/or the--.

Signed and Sealed this
Twenty-fifth Day of March, 2014

Michelle K. Lee
*Deputy Director of the United States Patent and Trademark Office*

UNITED STATES PATENT AND TRADEMARK OFFICE
CERTIFICATE OF CORRECTION

PATENT NO.       : 8,586,684 B2                                                        Page 1 of 1
APPLICATION NO. : 12/743673
DATED            : November 19, 2013
INVENTOR(S)      : Heckmeier et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 307 days.

Signed and Sealed this
Twenty-second Day of September, 2015

Michelle K. Lee
*Director of the United States Patent and Trademark Office*